(12) United States Patent
Mathieu

(10) Patent No.: US 11,815,541 B2
(45) Date of Patent: Nov. 14, 2023

(54) FAULT LOCATION SYSTEM

(71) Applicant: POMA, Voreppe (FR)

(72) Inventor: Christian Paul Mathieu, Voreppe (FR)

(73) Assignee: POMA, Voreppe (FR)

( * ) Notice: Subject to any disclaimer, the term of this patent is extended or adjusted under 35 U.S.C. 154(b) by 0 days.

(21) Appl. No.: 17/670,024

(22) Filed: Feb. 11, 2022

(65) Prior Publication Data

US 2022/0252656 A1  Aug. 11, 2022

(30) Foreign Application Priority Data

Feb. 11, 2021 (FR) ...................................... 2101331

(51) Int. Cl.
*G01R 31/11* (2006.01)
*G01R 31/08* (2020.01)
*G01R 31/28* (2006.01)

(52) U.S. Cl.
CPC ............ *G01R 31/11* (2013.01); *G01R 31/085* (2013.01); *G01R 31/088* (2013.01); *G01R 31/2812* (2013.01)

(58) Field of Classification Search
CPC .... G01R 31/11; G01R 31/085; G01R 31/088; G01R 31/2812; G01R 31/08; G01R 31/083; G01R 31/52; G01R 31/58; B61B 12/06; H02H 1/0007; H02H 5/10
USPC ......................................................... 324/521
See application file for complete search history.

(56) References Cited

U.S. PATENT DOCUMENTS

2014/0361785 A1* 12/2014 Radan .................. G01R 31/083
324/521

* cited by examiner

*Primary Examiner* — Farhana A Hoque
(74) *Attorney, Agent, or Firm* — RAY QUINNEY & NEBEKER P.C.; Paul N. Taylor

(57) ABSTRACT

A fault location system in a cable transport installation comprises a safety unit (10) and an end module (13) connected by an electrical safety line (11). The safety line (11) comprises a plurality of cable fault contacts (14) of the normally-closed type connected in series. The location system includes a plurality of location modules (20) distributed along the transport installation, each of which comprising a first test contact (21), of the normally-open type, for short-circuiting the safety line (11). Once a fault coming from one of the cable fault contacts (14) is detected, each location module (20) is capable of selectively closing its first test contact (21) so as to be able to locate said faulty contact (14) on the safety line.

16 Claims, 3 Drawing Sheets

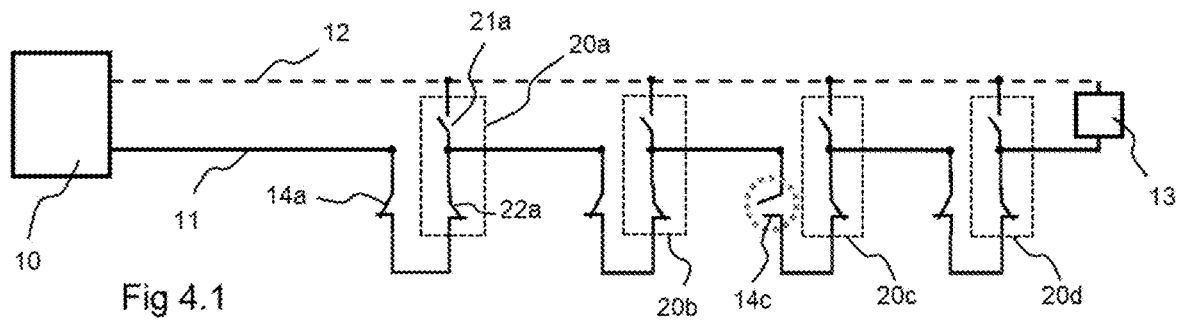
Fig 4.1
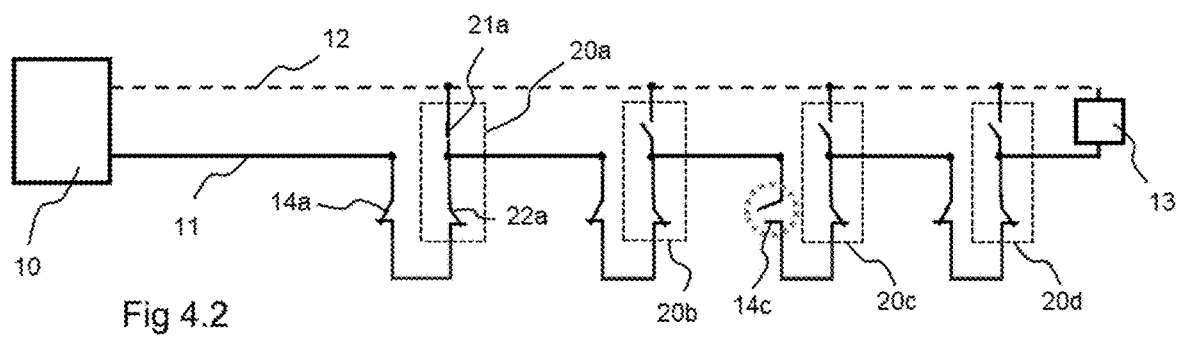
Fig 4.2
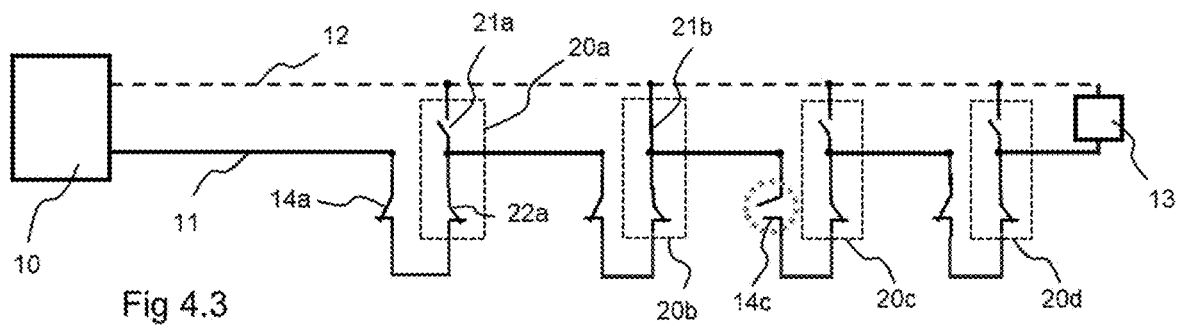
Fig 4.3
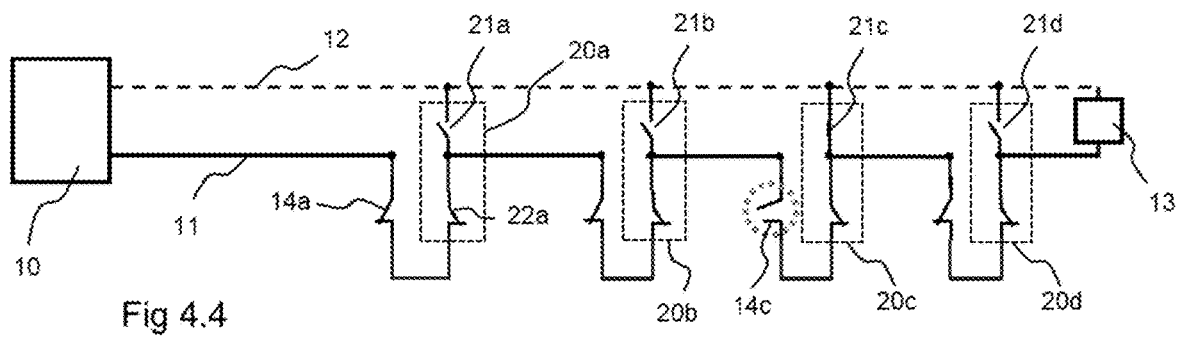
Fig 4.4

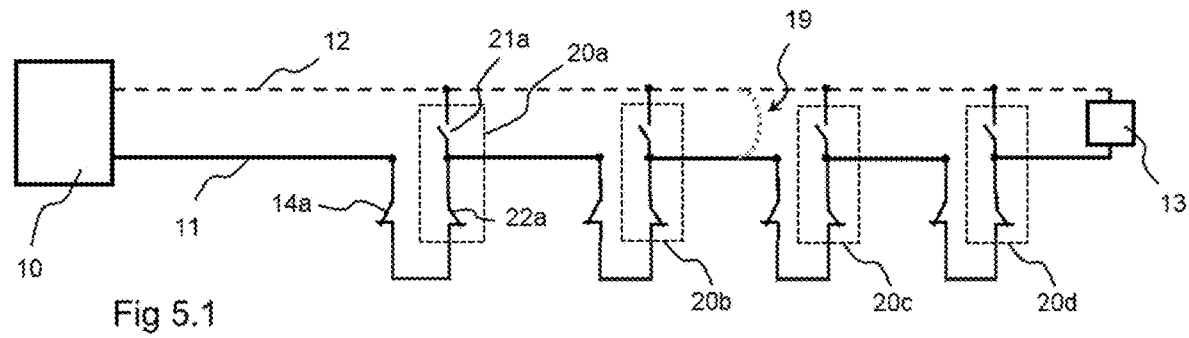
Fig 5.1
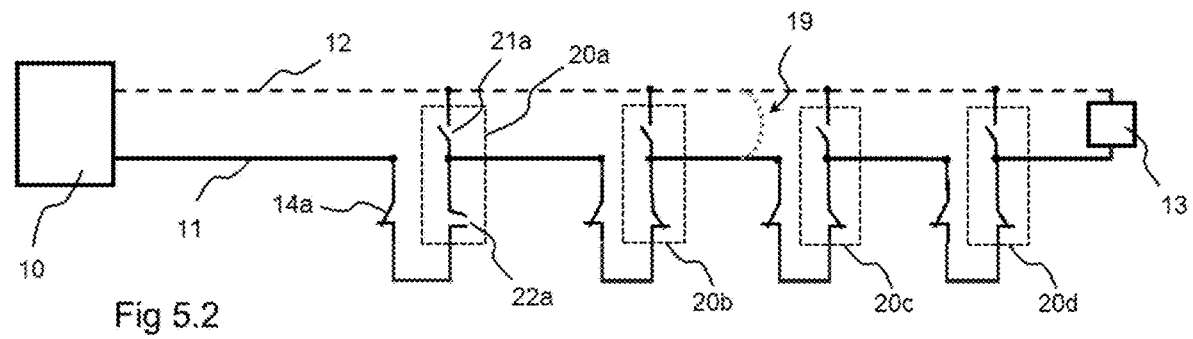
Fig 5.2
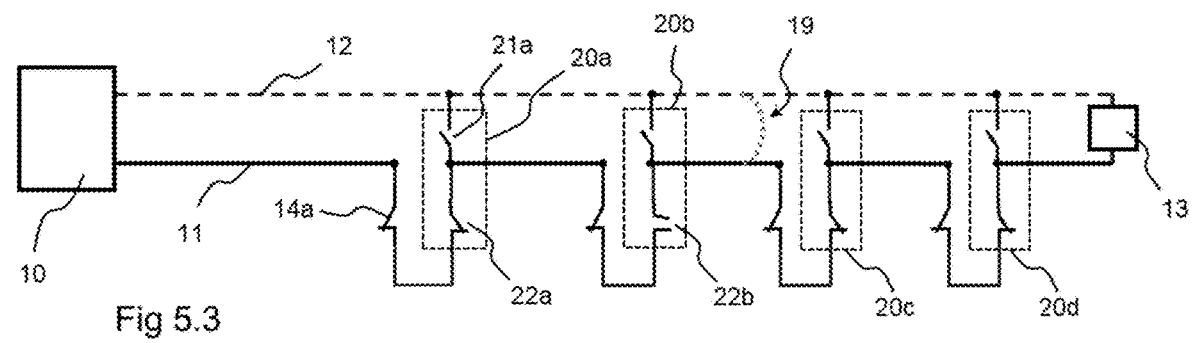
Fig 5.3
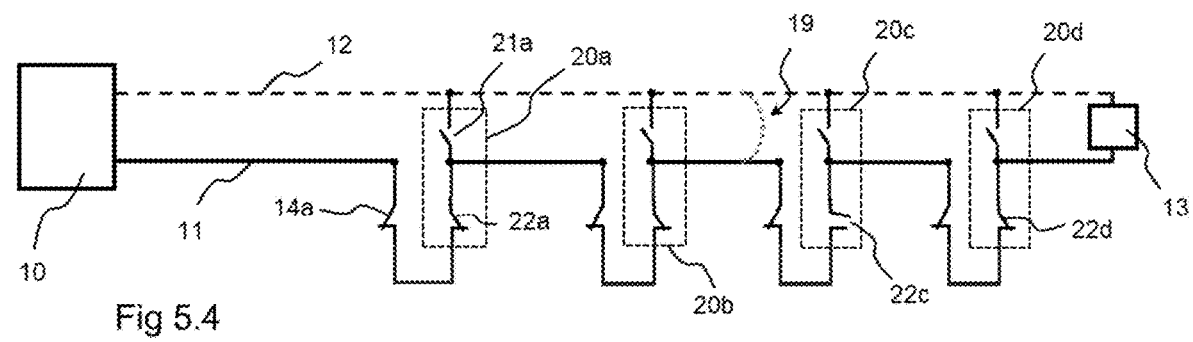
Fig 5.4

FAULT LOCATION SYSTEM

TECHNICAL FIELD OF THE INVENTION

Generally speaking, the invention relates to the technical field of facilities intended for the transport of people or equipment by aerial cable, particularly mechanical lifts used at ski resorts such as gondolas, chairlifts, and ski tows.

The invention also relates more specifically to a fault location system over an electrical safety line running along such a cable transport installation.

PRIOR ART

By means known per se, a cable transport installation includes at least one so-called electrical safety line to which are connected in series a plurality of cable-fault electrical contacts that are distributed along the transport installation. These fault contacts are located at the various pylons of the installation, for example, and are actuated by mechanical fault detectors which detect a derailing incident of the cable at a pylon thanks, for example, to breakable safety bars.

As soon as one of the fault contacts is opened, meaning, for instance, a cable derailing, the continuity of the safety line is broken thus allowing the transport installation to be stopped quickly for obvious safety reasons.

However, when such a fault occurs, it is essential to be able to locate the fault as best possible so as to be able to correct it as quickly as possible and thus minimize the shutdown of the installation. But an aerial cable transport installation covers a great distance with a large number of pylons which may be difficult and time-consuming to access, especially on mountains. Hence the importance of having a system that helps operators locate a fault.

There are already solutions that assist in locating a cable fault. For example, document EP0180501 describes a device in which locating is done by measuring the time needed for an electrical signal to travel the distance between the electrical signal transmitter, located, for example, at a base station or safety unit, and the fault detector. However, such a system may become less precise and less reliable over time, particularly due to wear and tear on the device.

Another solution disclosed in document FR2504482 consists in connecting each fault contact to a resistor in parallel, the value of which is predetermined and specific to the position of the fault contact within the installation. When one of the fault contacts is opened, the overall resistance of the safety line changes according to the value of the resistance of the opened contact. By measuring the change in voltage over the safety line, the value of the parallel resistor can be deduced and the faulty contact can thereby be identified. However, such a system is also imprecise for extensive installations with numerous fault contacts. In addition, since a separate resistance value in parallel with each fault contact is necessary, maintaining such a system is complicated. Such a system would likewise cease to be functional if two faults were to occur at the same time.

DISCLOSURE OF THE INVENTION

For this reason the invention aims to remedy all or some of the drawbacks of the prior art by offering a simple and reliable solution for locating a cable fault in a transport installation.

To that end, the invention describes a fault location system in a cable transport installation, the location system comprising a safety unit, an end module, and an electrical safety line connecting the safety unit to the end module, the safety line comprising a plurality of cable fault contacts of the normally-closed type that are connected in series along the safety line and which, when opened, signal a cable fault in the transport installation. The location system is characterized in that said system comprises a plurality of location modules distributed along the transport installation, each of which comprising a first test contact of the type normally open type making it possible to short-circuit the safety line, and in that, once a fault coming from one of the cable fault contacts is detected, each location module is capable of selectively closing its first test contact so that said faulty contact on the safety line can be located.

According to a feature, each location module also comprises a second test contact of the normally closed type connected in series along the safety line. After a short-circuit fault is detected on the safety line, each location module is capable of selectively opening its second test contact so that said short-circuit fault on the safety line can be located.

According to another feature, the safety unit comprises detection means for detecting a cable fault and a short-circuit fault occurring on the safety line.

According to another feature, the safety unit comprises means for communicating with the location modules in order to request closure of the first test contact of the location modules so that, when a cable fault coming from one of the cable fault contacts is detected, the safety unit carries out an iterative sequence by asking location modules to temporarily close the first test contact, one after the other, until the location of the cable fault between two consecutive location modules is determined.

According to another feature, the safety unit comprises means for communicating with the location modules in order to request the opening of the second test contact of the location modules so that, when a short-circuit fault occurring on the safety line is detected, the safety unit carries out an iterative sequence by asking location modules to temporarily open their second test contact, one after the other, until the location of the short-circuit fault between two consecutive location modules is determined.

According to another feature, each location module comprises detection means for detecting a cable fault and a short-circuit fault occurring on the safety line. When a cable fault coming from one of the cable fault contacts is detected, each location module closes its first test contact for a predetermined time that is a function of the ranking of the location module in the transport installation. Similarly, when a short-circuit fault is detected on the safety line, each location module opens its second test contact for a predetermined time that is a function of the ranking of the location module in the transport installation.

The invention also describes a method for locating a fault in a cable transport installation by means of such a location system. When a cable fault coming from one of the cable fault contacts is detected, the safety unit carries out an iterative sequence by asking location modules to temporarily close their first test contact, one after the other, while analyzing the signals traveling over the safety line, until the location of the cable fault between two consecutive location modules is determined. When a short-circuit fault occurring on the safety line is detected, the safety unit carries out an iterative sequence by asking location modules to temporarily open their second test contact, one after the other, while analyzing the signals traveling over the safety line, until the location of the short-circuit fault between two consecutive location modules is determined. According to one feature, the iterative sequence is incremental, decremental, or dichotomous.

BRIEF DESCRIPTION OF THE FIGURES

Other features and advantages of the invention will become clear from the following description given in reference to the appended figures, in which.

DETAILED DESCRIPTION OF AN EMBODIMENT

Figure 1:
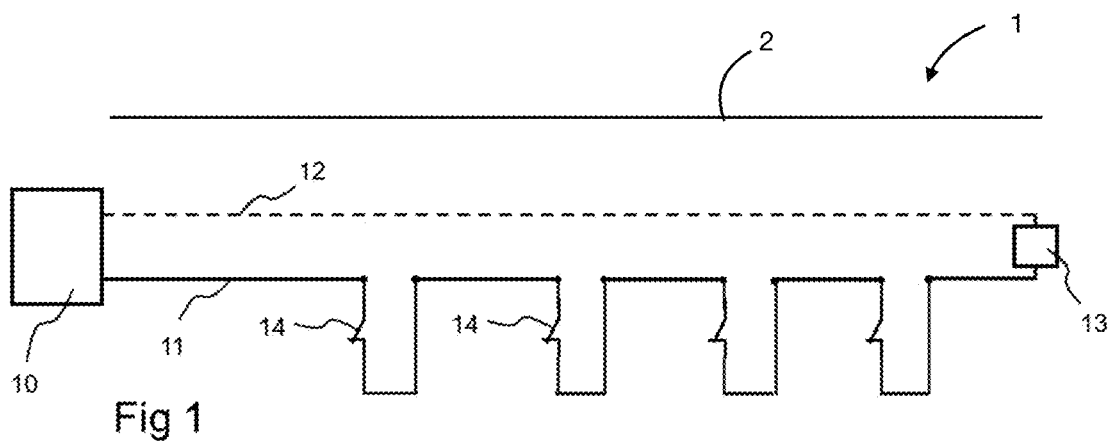
FIG. 1 shows a simplified schematic view of one embodiment of a prior-art safety line in a cable transport installation.

In reference to FIG. 1, a cable fault detection system for a cable transport installation 1 comprises, by known means, an electrical safety circuit connected between a central safety unit 10, on one end, and an end module 13, on the other end. The safety circuit consists of a main safety line 11 and a return line 12. The end module 13 includes, for example, a diode whose cathode is connected to ground, and the safety unit 10 is also connected to ground, so that the return line 12 of the safety circuit in reality passes through the ground.

The safety unit 10 is a control and monitoring module that is generally located at a drive station of the transport installation. It includes means for transmitting signals over the safety line 11 as well as means for detecting an opening of the safety line 11 or a short-circuit occurring on the safety line 11, by analyzing the signals traveling over the safety line 11. Preferably, it also includes man-machine signaling and dialog means, particularly for signaling the location of a fault to the operators of the transport installation.

The safety line 11 includes a plurality of fault contacts 14, which represent a fault of the installation cable 2, such as a derailment. They are of the normally-closed type and are connected in series along the safety line 11. In this document, a contact is of the "normally closed" type if it is in the closed (that is, electrically conductive) position by default, in the absence of any commands. Conversely, a contact is of the "normally open" type if it is in the open (that is, electrically non-conductive) position by default, in the absence of any commands. Thus, during normal operation, when all the cable fault contacts 14 are in the closed position, the safety circuit formed by the safety line 11 and the return line 12 is conductive. However, if one of the fault contacts 14 changes to the open position, the safety circuit 11 will be broken causing a cable fault. For the sake of simplifying the drawings, the example shown in the figures only includes four fault contacts 14 spread out along the safety line 11.

A fault contact 14 directly consists, for example, of a breakable conductive bar which can be placed in the vicinity of a roller, at a pylon, on which the cable passes, and which, when broken, indicates that the cable has left its position on the roller. Mechanical breakable bars which, when broken, actuate a position sensor serving as a fault contact 14, could also be used. Preferably, there is a plurality of fault contacts 14 on each pylon of the installation.

Figure 2:
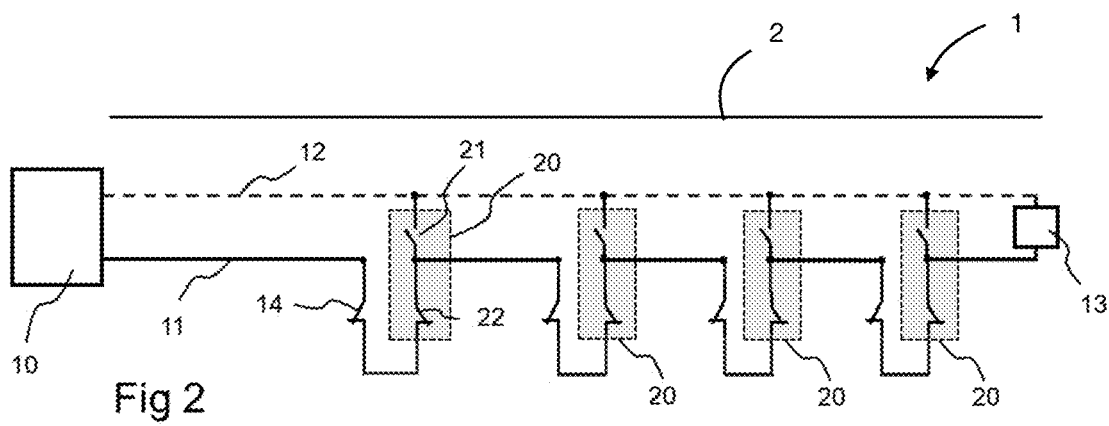
FIG. 2 is a simplified schematic view of a safety line according to the invention.

In reference to FIG. 2, the location system according to the invention includes a plurality of location modules 20 distributed over the transport installation. Each location module 20 includes a contact 21 of the normally-open type, called a first test contact, as well as electronic control means for said contact 21. The first test contact 21 is configured so that when it is ordered to close, this short-circuits the safety line 11, for example by connecting it to ground.

The location modules 20 can be placed, for example, at each pylon, but depending on the geographical configuration of the transport installation and the desired precision of the fault location, a decision may be made to have a plurality of location modules 20 per pylon, or one location module 20 for several pylons. However, it is clear that the greater the number of location modules 20, the more precise the location of a cable fault or of a short-circuit fault.

For the sake of simplifying the drawings, the example shown in the various figures includes four location modules 20 connected along the safety line 11 downstream of each fault contact 14. In this document, by convention a point A will be said to be downstream of a point B on the safety line 11 if the point B is physically located between the safety unit 10 and the point A. Likewise, a point A will be said to be upstream of a point B on the safety line 11 if the point A is physically located between the safety unit 10 and the point B.

According to the invention, the first test contacts 21 are used to located faults coming from one of the cable fault contacts 14. To do this, when a cable fault is detected, that is, when one of the cable fault contacts 14 is open, each location module 20 is capable of temporarily and selectively closing its first test contact 21 so as to be able to locate the faulty cable fault contact 14 on the safety line 11, according to an operation that will be described in detail below.

In addition, it is also important for the operators of the transport installation to also be able to locate any short-circuit faults that may unexpectedly arise along the safety line 11. When a short-circuit fault occurs, such as an accidental grounding due to a poor electrical connection on one of the pylons, the safety line 11 is no longer operational and it is therefore preferable to quickly locate this fault to avoid a prolonged shutdown of the transport installation.

For this reason, each location module 20 may also advantageously include a supplemental contact called a second test contact 22, as well as electronic control means for said second test contact 22. The second test contact 22 is a normally-closed contact and is configured so that, when it is ordered to open, this creates an opening in the safety line 11.

The second test contacts 22 are used to locate short-circuit faults on the safety line 11 because, according to the invention, when a short-circuit is detected, each location module 20 is capable of temporarily and selectively opening its second test contact 22 so as to be able to locate said short-circuit fault on the safety line 11, according to an operation that will be described in detail below.

FIGS. 4.1 to 4.4 show in detail an embodiment of the operation of the sequence to be carried out in order to locate a cable fault. In these figures, one can see four location modules 20 called 20a, 20b, 20c, and 20d, respectively, each comprising a first test contact 21, called 21a, 21b, 21c, and 21d, respectively.

FIG. 4.1 shows the occurrence of a cable fault represented by the opening of the cable fault contact 14c, which causes the safety line 11 to be opened. After this opening of the safety line 11 is detected by the safety unit 10, an iterative sequence for locating the cable fault is started. Indeed, the safety unit 10 will ask the location modules 20 to temporarily close their first test contact 21 one by one (that is, separately one after the other) and will analyze the signals traveling over the safety line 11 after each closing, until the location of the cable fault between two consecutive location modules 20 is determined.

The safety unit 10 therefore selects a first location module 20a (for example, the one located closest to the safety unit 10) and asks it to make a temporary short-circuit (for example, for 1 second) by closing its first test contact 21a, as indicated in FIG. 4.2. At that moment, if the safety unit 10 detects that the safety line 11 is no longer open but is conducting by short-circuit, it means that the cable fault contact 14c which is open lies downstream of the first test contact 21a (which is the case in FIG. 4.2), that is, that the first location module 20a is located between the safety unit 10 and the faulty cable fault contact 14c.

Next, after waiting for the first test contact 21a to be opened again, the safety unit 10 selects a second location module 20b to in turn make a temporary short-circuit, and asks it to close its first test contact 21b, as indicated in FIG. 4.3. At that moment, if the safety unit 10 again detects that the safety line 11 is no longer open but is conducting by short-circuit, it means that the cable fault contact 14c still lies downstream of the first test contact 21b (which is the case in FIG. 4.3), that is, that the second location module 20b is located between the safety unit 10 and the faulty cable fault contact 14c.

Next, after waiting for the first test contact 21b to be opened again, the safety unit 10 selects a third location module 20c to in turn make a temporary short-circuit by closing its first test contact 21b, as indicated in FIG. 4.4. Contrary to the two preceding cases, the safety unit 10 will not detect a short-circuit, but will continue to see the safety line 11 as open. This means that the cable fault contact 14c is now located upstream of the first test contact 21c, that is, the faulty cable fault contact 14c is located between the safety unit 10 and the third location module 20c. In this way, it is easy to deduce that the cable fault is located between the consecutive location modules 20b and 20c, which completes the cable fault location sequence.

In a location system comprising a number N of location modules 20, several types of iterative sequences are possible. In the example of FIGS. 4.1 to 4.4, the sequence is referred to as incremental because it starts with the location module 20a of ranking 1 (closest to the safety unit 10) and the ranking of the location module to be temporarily short-circuited is then incremented iteratively until the ranking i is found for which the safety unit 10 no longer detects the short-circuit in the safety line 11, so as to deduce that the fault is located between the location modules 20 of rankings i and i−1.

In an equivalent way, the sequence could be decremental, that is, starting with the last location module of ranking N (closest to the end module 13) and the ranking of the location module to be temporarily short-circuited is then decremented iteratively until the ranking i is found in which the safety unit 10 detects a short-circuit in the safety line 11, so as to deduce that the fault is located between the location modules of rankings i and i+1.

Likewise, the sequence could be dichotomous, that is, starting by temporarily short-circuiting the location module of ranking N/2 (or close to N/2) to separate the safety line 11 into two zones and then, depending on the result, continuing with the location module 20 of either ranking 3 N/4 or ranking N/4 and continuing in this fashion by separating into two zones upon each iteration until consecutive rankings are reached. The dichotomous sequence may have the advantage of being faster if the number N of location modules is large.

FIGS. 5.1 to 5.4 show in detail an embodiment of the operation of the sequence to be carried out in order to locate a short-circuit fault. In these figures, one can see four location modules 20 called 20a, 20b, 20c, and 20d, respectively, each comprising a second test contact 22, called 22a, 22b, 22c, and 22d, respectively.

FIG. 5.1 shows the occurrence of a short-circuit fault between the safety line 11 and ground occurring at a location denoted 19. After this short-circuit on the safety line 11 is detected by the safety unit 10, an iterative sequence for locating the short-circuit fault is started. Indeed, the safety unit 10 will ask location modules 20 to open their second test contact 22 one by one (that is, separately one after the other) and will analyze the signals traveling over the safety line 11 after each opening, until the location of the short-circuit 19 between two consecutive location modules 20 is determined.

The safety unit 10 therefore selects a first location module 20a (for example, the one located closest to the safety unit 10) and asks it to temporarily open the safety line 11 (for example, for 1 second) by opening its second test contact 22a, as indicated in FIG. 5.2. At that moment, if the safety unit 10 detects that the safety line 11 is no longer short-circuited but is open, it means that the location of the short-circuit 19 is downstream of the second test contact 22a (which is the case in FIG. 5.2), that is, that the first location module 20a is located between the safety unit 10 and the short-circuit 19.

Next, after waiting for the second test contact 22a to be closed again, the safety unit 10 selects a second location module 20b and in turn asks it to temporarily open the safety line 11 by opening its second test contact 22b, as indicated in FIG. 5.3. At that moment, if the safety unit 10 again detects that the safety line 11 is no longer short-circuited but is open, it means that the location of the short-circuit 19 is still downstream of the second test contact 22b (which is the case in FIG. 5.3), that is, that the first location module 20b is located between the safety unit 10 and the short-circuit 19.

Next, after waiting for the second test contact 22b to be opened again, the safety unit 10 selects a third location module 20c to in turn temporarily open the safety line 11 and asks it to open its second test contact 22c, as indicated in FIG. 5.4. Contrary to the two preceding cases, the safety unit 10 will not detect the opening of the safety line 11, but will continue to see it as short-circuited. This means that the short-circuit 19 is now located upstream of the second test contact 22c, that is, the short-circuit 19 is located between the safety unit 10 and the third location module 20c. In this way, it is easy to deduce that the short-circuit 19 is located between the consecutive location modules 20b and 20c, which completes the short-circuit fault location sequence.

In the same way as for the cable fault location sequences, several types of sequences are possible for locating a short-circuit as part of the invention, that is, an incremental, decremental, dichotomous, or other type of sequence.

Figure 3:
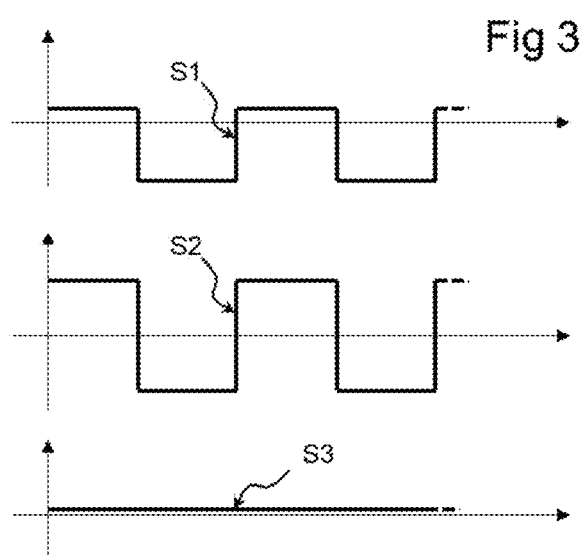
FIG. 3 shows an example of diagrams of voltage signals traveling over the safety line, FIGS. 4.1 to 4.4 show an example of a sequence for locating a cable fault occurring on the safety line, FIGS. 5.1 to 5.4 show an example of a sequence for locating a short-circuit fault occurring on the safety line.

In order to augment the reliability of the system, the safety unit 10 does not transmit a constant signal over the safety line 11, but instead transmits a variable signal, such as a periodic square-wave voltage signal with an amplitude on the order of +/−12V and with a period on the order of a few tens of milliseconds (for example, 55 milliseconds, which is approximately 18 Hz). In this embodiment, the voltage-versus-time diagrams are shown in FIG. 3. This figure shows three voltage curves S1, S2, and S3 on the safety line 11, as a function of the various situations. The first curve S1 shows the signal measured by the safety unit 10 or by the location modules 20 when operation is normal during the transmission of a square-wave signal. In this curve S1, the positive half-wave of the measured signal is indeed attenuated due to the diode of the end module 13, which conducts to ground on this half-wave.

When a cable fault causes the safety line 11 to open, the second curve S2 of FIG. 3 represents the signal measured by the safety unit 10 or by a location module 20 placed upstream of the open cable fault contact 14. Even current is no longer flowing over the safety line 11, the curve S2 corresponds directly to the voltage signal transmitted by the safety unit 10, without attenuation given that the diode of the end module 13 is no longer connected.

The third curve S3 corresponds to a zero signal measured in the event of a short-circuit on the safety line 11. The third curve S3 also corresponds to the signal that could be measured by a location module 20 located downstream of a cable fault (that is, between the open fault contact 14 and the end module 13), because this location module is indeed no longer detecting anything, since the safety line 11 is open upstream.

The safety unit 10 can communicate with the location modules 20 of the location system according to a standardized or non-standardized protocol. The physical medium for this communication is either wired or wireless by means of, for example, a WiFi network or an LPWAN (Low Power Wide Area Network), or by other means. If communication is wired, it can take place either directly on the conductors of the safety line 11 by overlaying the communication signals on the periodic square-wave signal, or preferably by using other conductors potentially available in the multi-strand electrical cable used for the safety line 11. For a new installation, wired communication with dedicated electrical conductors is preferably used. But if an existing installation is being renovated and no other conductors are available, communication is overlaid over the conductor of the safety line 11.

This communication allows the safety unit 10 to control the iterative location sequences by sending orders to the location modules 20 to open and close their test contacts 21, 22. In addition, in order to augment the reliability of this communication, during the iterative sequences when the safety unit 10 sends an order to a location module 20 to close its first test contact 21 or to open its second test contact 22, the communication protocol can have this location module 20 send a confirmation back to the safety unit 10 by return communication to indicate that the order has been executed.

However, when the communication directly uses the conductor of the safety line 11, it is clear that an opening or a short-circuiting of this safety line 11 makes communication impossible between the safety unit 10 and all or some of the location modules 20. For this reason, another embodiment that does not depend on this communication is proposed in this case.

In this embodiment, the various location modules 20 can themselves analyze the signals traveling over the safety line 11. They therefore have the means to detect a cable fault and a short-circuit fault occurring on the safety line 11 and are capable of selectively closing their first test contact 21 or opening their second test contact 22.

Thus, when an opening of the safety line 11 is detected by the location modules 20, the sequence is as follows: the first location module 20, that is, the module with a ranking of 1, creates a short-circuit by closing its first test contact 21 for 1 second and then opening it again for 1 second. The location module 20 with a ranking of 2 therefore waits 2 seconds before closing, in turn, its first test contact 21 for 2 seconds and then reopening it for 1 second. Likewise, the location module 20 with a ranking of 3 therefore waits 5 seconds before closing its first test contact 21 for 3 seconds and then reopening it for 1 second. And so it goes, each location module 20 with a ranking of i waits for a time equal to $((i-1)*(i/2+1))$ seconds before closing its first test contact 21 for a period of time of i seconds and then reopening it for 1 second. Thus, by measuring the number i of seconds during which a temporary short-circuit is created, it is possible to know that the temporary short-circuit was created by the location module 20 of ranking i without the need for communication between the location modules 20 and the safety unit 10.

Likewise, when a short-circuit fault is detected by the location modules 20, the sequence is as follows: the first location module 20 of ranking 1 creates a temporary opening of the safety line 11 by opening its second test contact 22 for 1 second and then closing it for 1 second. The location module 20 with a ranking of 2 therefore waits 2 seconds before opening its second test contact 22 for 2 seconds and then closing it for 1 second. And so it goes, each location module 20 with a ranking of i waits for a time equal to $((i-1)*(i/2+1))$ seconds before opening its second test contact 22 for a period of time of i seconds and then closing it for 1 second. Thus, by measuring the number i of seconds during which the safety line 11 is temporarily opened, it is possible to know that the temporary opening was created by the location module 20 of ranking i without the need for communication between the modules and the safety unit.

The electrical power supply of the location modules 20 can be provided in several ways: the modules may be autonomous if they have an internal battery or if they are powered by a solar panel of a pylon, for example. But to avoid installing a local power source, they may also be powered via an available conductor in the multi-strand electrical cable used for the safety line. Lastly, the power supply may come directly from the safety line 11 by means of the square-wave signal, which is enough to charge a battery or a capacitor, but it may then be subject to breaks in the safety line 11.

The invention also proposes a solution for better apprehending the problem of inadvertent or transient faults that may occur in a cable transport installation, particularly due to vibrations on the pylon rollers or difficult weather conditions (ice, rain, wind, etc.). These random faults may also be transient openings of the safety line 11 as well as transient short-circuits. It turns out that when a fault only occurs transiently and not clearly, finding the true cause is very long and tedious.

To that end, it is already known that redundancy can be ensured by installing two safety lines in parallel along the transport installation, with, for example, a set of pairs of bars that are joined two-by-two, with each bar being connected to one of the safety lines. A first type of operation is to work in a so-called Normal—Backup mode, that is, only a single one of the two safety lines is active at a given time and, if a failure is detected on the active line, a switch to the other safety line can easily be made. A second type of operation is also possible: the two lines are active while the transport installation is in operation. In the event of a failure on one of the two lines, the operator, after proceeding with certain safety checks, selects the line remaining operational and restarts the installation.

Thanks to this redundancy and to the location system of the invention, it is easier to locate a fault on the safety line suffering from transient faults when it is not active. To better isolate a fault, an attempt is made to shorten that line by segmenting it into two parts and monitoring the remaining part for a long enough period of time to see whether the transient fault continues to occur or not under the same conditions.

In order to segment the line, the safety unit 10 asks a location module 20 approximately located in the middle of the safety line to perform an inverse action of the detected fault: that is, to either open its second test contact 22 if the transient fault is a short-circuit, or to close its first test contact 21 if the transient fault is a cable fault. If the transient fault continues to occur under the same conditions, it means that the fault is located in the upstream portion of the line between the safety unit 10 and the location module 20. If the transient fault no longer occurs under the same conditions, it means that the fault is located in the downstream portion of the line between the location module 20 and the end module 13. The dichotomous sequence is then reiterated by again segmenting the identified portion of the safety line in two, until the inadvertent fault is located between two consecutive location modules.

In addition, self-tests can be conducted on the location system to ensure that it is functioning properly. Preferably, these self-tests are conducted when the transport installation is not operating to not jeopardize operational safety, for example once a day before the installation is started up. The safety unit asks each location module 20 to perform in succession a micro-closing of their first test contact 21 and then a micro-opening of their second test contact 22, and to analyze the impact on the signal over the safety line 11.

In order to set and store the ranking number i in each location module 20, it can, for example, be predetermined by means of a serial number or microswitches in the location module 20. However, it is preferable to be able to set this ranking number i by software during a configuration phase while connected to a computer, such as prior to on-site installation of the location module 20.

Naturally, the invention is described above as an example. It is understood that a person skilled in the art is capable of making different embodiment variants of the invention without exceeding the scope of the invention.

The invention claimed is:

1. An aerial cable transport installation, comprising an aerial cable for transporting people or equipment and a fault location system,
    the fault location system comprising a safety unit, an end module, and an electrical safety line running along the aerial cable transportation installation and connecting the safety unit to the end module,
    the electrical safety line comprising a plurality of cable fault contacts, of the normally-closed type, which are connected in series along the electrical safety line and which, when opened, signal a cable fault in the aerial cable transport installation, wherein:
    the fault location system includes a plurality of location modules distributed along the aerial cable transport installation, each of which comprising a first test contact, of the normally-open type, for short-circuiting the electrical safety line,
    wherein once a fault coming from a faulty contact amongst the cable fault contacts is detected, each location module is capable of selectively closing the first test contact thereof to locate the faulty contact on the safety line.

2. The aerial cable transport installation of claim 1, wherein:
    each location module comprises a second test contact, of the normally closed type, connected in series along the safety line,
    wherein after a short-circuit fault is detected on the safety line, each location module is capable of selectively opening the second test contact thereof to locate the short-circuit fault on the safety line.

3. The aerial cable transport installation of claim 1, wherein the safety unit comprises detection means for detecting a cable fault and a short-circuit fault occurring on the safety line.

4. The aerial cable transport installation of claim 1, wherein the safety unit comprises means for communicating with the location modules to request that the first test contact of the location modules be closed.

5. The aerial cable transport installation of claim 4, wherein when a cable fault coming from one of the cable fault contacts is detected, the safety unit carries out an iterative sequence by asking one of the location modules to temporarily close the first test contact thereof and repeating said iterative sequence for other ones of the location modules one after the other, until a location of the cable fault between two consecutive ones of the location modules is determined.

6. The aerial cable transport installation of claim 2, wherein the safety unit comprises means for communicating with the location modules to request that the second test contact of the location modules be opened.

7. The aerial cable transport installation of claim 6, wherein when a short-circuit fault occurring on the safety line is detected, the safety unit carries out an iterative sequence by asking one of the location modules to temporarily open the second test contact thereof, and repeating said iterative sequence for other ones of the location modules one after the other, until a location of the short-circuit fault between two consecutive ones of the location modules is determined.

8. The aerial cable transport installation of claim 2, wherein each of the location modules comprises detection means for detecting a cable fault and a short-circuit fault occurring on the safety line.

9. The aerial cable transport installation of claim 8, wherein when a cable fault coming from one of the cable fault contacts is detected, each of the location modules closes the first test contact thereof for a predetermined time that is a function of a location rank thereof in the aerial cable transport installation.

10. The aerial cable transport installation of claim 2, wherein when a short-circuit fault is detected on the safety line, each of the location modules opens the second test contact thereof for a predetermined time that is a function of a location rank thereof in the aerial cable transport installation.

11. A method for locating a fault in an aerial cable transport installation for transporting people or equipment by aerial cable, the method using a fault location system comprising a safety unit, an end module, and an electrical safety line running along the aerial cable transportation installation and connecting the safety unit to the end module,
    the electrical safety line comprising a plurality of cable fault contacts, of the normally- closed type, which are connected in series along the electrical safety line and which, when opened, signal a cable fault in the aerial cable transport installation, wherein:
    the fault location system includes a plurality of location modules distributed along the aerial cable transport installation, each of which comprising a first test contact, of the normally- open type, for short-circuiting the electrical safety line, wherein, when a cable fault coming from one of the cable fault contacts is detected, the safety unit carries out an iterative sequence by asking one of the location modules to temporarily close the first test contact thereof and repeating said iterative sequence for other ones of the location modules one after the other, and by analyzing signals traveling over the safety line, until a location of the cable fault between two consecutive location modules is determined.

12. The method of claim 11, wherein each location module comprises a second test contact, of the normally closed type, connected in series along the safety line and wherein when a short-circuit fault occurring on the safety line is detected, the safety unit carries out a further iterative sequence by asking one of the location modules to temporarily open the second test contact thereof, and by repeating the further iterative sequence for others of the location modules one after the other, and by analyzing signals traveling over the safety line, until a location of the short-circuit fault between two consecutive ones of the location modules is determined.

13. The method for locating a fault of claim 11, wherein the iterative sequence is incremental, decremental, or dichotomous.

14. The method for locating a fault of claim 12, wherein the further iterative sequence is incremental, decremental, or dichotomous.

15. The method for locating a fault of claim 12, wherein when a cable fault coming from one of the cable fault contacts is detected by one of the location modules, each of the location module closes the first test contact thereof for a predetermined time that is a function of a location rank thereof in the aerial cable transport installation.

16. The method for locating a fault of claim 12, wherein when a short-circuit fault is detected on the safety line by one of the location modules, each of the location modules opens the second test contact thereof for a predetermined time that is a function of a location rank thereof in the aerial cable transport installation.

* * * * *